(12) United States Patent
Jo et al.

(10) Patent No.: US 12,276,684 B2
(45) Date of Patent: Apr. 15, 2025

(54) METHOD AND APPARATUS FOR DETERMINING CABLE LENGTH FOR PLASMA PROCESSING EQUIPMENT

(71) Applicant: SEMES CO., LTD., Cheonan-si (KR)

(72) Inventors: Tae Hoon Jo, Seoul (KR); Hyo Seong Seong, Changwon-si (KR); Ji Hyun Kim, Ansan-si (KR); Ja Myung Gu, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 210 days.

(21) Appl. No.: 17/992,972

(22) Filed: Nov. 23, 2022

(65) Prior Publication Data
US 2023/0194585 A1 Jun. 22, 2023

(30) Foreign Application Priority Data
Dec. 17, 2021 (KR) .......................... 10-2021-0181569

(51) Int. Cl.
*G01R 27/16* (2006.01)
(52) U.S. Cl.
CPC .................................. *G01R 27/16* (2013.01)
(58) Field of Classification Search
CPC .. G01R 27/16; G01R 31/3648; G01R 31/367; G01R 31/3842; G01R 31/386; G01R 31/389; H02J 7/0047; H02J 7/0048; H02J 7/005
USPC ....................... 324/76.11, 500, 650, 425–434
See application file for complete search history.

(56) References Cited

U.S. PATENT DOCUMENTS

| 6,886,438 | B2 * | 5/2005 | Viviroli ................ H02G 1/1256 83/947 |
| 8,628,640 | B2 | 1/2014 | Hayami et al. |
| 9,072,159 | B2 | 6/2015 | Yuzurihara et al. |
| 9,594,105 | B2 | 3/2017 | Howald et al. |
| 9,927,481 | B2 | 3/2018 | Howald et al. |
| 11,956,885 | B2 * | 4/2024 | Pokidov ................... H05H 1/28 |
| 2009/0278512 | A1 * | 11/2009 | Karlicek ........... H01J 37/32183 323/208 |
| 2018/0269035 | A1 * | 9/2018 | Selmo ............... H01J 37/32174 |
| 2021/0373064 | A1 * | 12/2021 | Li ........................ G01R 31/085 |
| 2023/0057795 | A1 * | 2/2023 | Pokidov .................... H05H 1/28 |

(Continued)

FOREIGN PATENT DOCUMENTS

| JP | 2004-247401 | 9/2004 |
| JP | 5210905 | 8/2010 |
| KR | 10-2014-0146231 | 12/2014 |

(Continued)

OTHER PUBLICATIONS

Kwon, K. and Lim, J., Design of a Transmission Line using Defected Ground Structure and Artificial Dielectric Substrate, Journal of the Korea Academia-Industrial cooperation Society, 2013.
(Continued)

*Primary Examiner* — Huy Q Phan
*Assistant Examiner* — Trung Q Nguyen

(57) ABSTRACT

Proposed are a method and an apparatus for determining a cable length for plasma processing equipment. More particularly, proposed is a method of determining a length of a power supply cable for plasma processing equipment that performs plasma processing through power supply at radio frequencies (RF) of several tens of MHz or more.

10 Claims, 5 Drawing Sheets

(56) References Cited

U.S. PATENT DOCUMENTS

2023/0246465 A1* 8/2023 Czerw ................. H02J 7/0042
                                                              307/9.1

FOREIGN PATENT DOCUMENTS

| KR | 10-1556874 | 12/2014 |
| KR | 10-2247844 | 7/2015 |
| KR | 10-2192299 | 12/2020 |

OTHER PUBLICATIONS

Office Action from the Korean Intellectual Property Office dated Oct. 21, 2023.

* cited by examiner

Fig. 3

| Physical length | Cable Z |
|---|---|
| | 381i |
| | 866i |
| | −717i |
| | 476i |
| | 1580i |

Actual physical length: 3m + 0.005m

| Physical length | Cable Z | electrical length |
|---|---|---|
| 3.040m | 288i | 3.031m |
| 3.025m | 282i | 3.031m |
| 3.000m | 293i | 3.032m |
| 3.035m | 275i | 3.030m |
| 3.020m | 301i | 3.033m |
| Error ± 0.005m | | Deviation: 0.3cm |

METHOD AND APPARATUS FOR DETERMINING CABLE LENGTH FOR PLASMA PROCESSING EQUIPMENT

CROSS REFERENCE TO RELATED APPLICATION

The present application claims priority to Korean Patent Application No. 10-2021-0181569, filed Dec. 17, 2021, the entire contents of which is incorporated by reference herein for all purposes.

BACKGROUND OF THE INVENTION

Field of the Invention

The present disclosure relates generally to a method and an apparatus for determining a cable length for plasma processing equipment. More particularly, the present disclosure relates to a method of determining a length of a power supply cable for plasma processing equipment that performs plasma processing through power supply at radio frequencies (RF) of several tens of MHz or more.

Description of the Related Art

A plasma processing apparatus is, for example, an apparatus that generates a plasma discharge by supplying radio frequency (RF) power to electrodes provided in a reaction chamber in which plasma is generated, and performs surface treatment of a substrate with the generated plasma. The plasma processing apparatus is used in semiconductor manufacturing and the like.

When power is supplied to a plasma load, it is known that a discharge voltage is decreased at a load end when the plasma discharge is started. Therefore, when a sufficient ignition voltage is not applied, a decrease in the discharge voltage at the load-end sometimes results in unstable plasma ignition. To make plasma ignition stable, an RF generator, which supplies power to the plasma load, is required to apply a high voltage, sufficient as an ignition voltage for generating plasma, to the load end.

In general, when determining the cable length of a cable for power supply of plasma equipment, the physical length of the cable is calculated and applied. According to the calculation of the physical length of the cable, there is no problem in using the cable at low frequencies. However, when radio frequencies of several tens of MHz or more are applied, there is a problem in that a difference in impedance of the cable causes a change in the process result.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Japanese Patent Application Publication No. 2004-247401
(Patent document 2) Japanese Patent No. 5210905

SUMMARY OF THE INVENTION

Accordingly, the present disclosure has been made keeping in mind the above problems occurring in the related art, and an objective of the present disclosure is to solve the problem in which when determining a cable for power supply of plasma equipment on the basis of a physical length, an impedance difference of the cable at radio frequencies (RF) causes a change in the process result.

The objectives of the present disclosure are not limited to those mentioned above, and other objectives not mentioned and advantages of the present disclosure will be clearly understood from the following description.

In order to achieve the above objective, according to one aspect of the present disclosure, there is provided a method of determining a cable length for plasma processing equipment, the method including: an impedance measuring step of measuring an impedance of a power supply cable to be applied; an electrical length calculating step of calculating an electrical length of the power supply cable on the basis of the measured impedance; and a cable length determining step of determining a length of the power supply cable on the basis of the calculated electrical length.

Preferably, the electrical length calculating step may be performed by calculating the electrical length by using a correlation of at least one of a wavelength, a wave number, and a measurement error with a frequency to be used.

As an example, the electrical length calculating step may be performed by calculating the electrical length through [Equation 1] below, $$L = \frac{n}{\lambda/2} + \frac{1}{\beta \times \arctan\left(-\frac{50}{Z}\right)} - e \quad \text{[Equation 1]}$$

wherein L may be the electrical length, n may be a wavelength period, λ may be the wavelength, β may be the wave number, Z may be an open impedance, and e may be the measurement error.

Preferably, the impedance measuring step may be performed by calculating the impedance on the basis of an S parameter for the power supply cable to be applied.

As an example, the impedance measuring step may be performed by calculating a reflection coefficient on the basis of an S parameter.

According to another aspect of the present disclosure, there is provided an apparatus for determining a cable length for plasma processing equipment, the apparatus including: an impedance measuring part configured to measure an impedance of a power supply cable to be applied; an electrical length calculating part configured to calculate an electrical length of the power supply cable on the basis of the measured impedance; and a cable determining part configured to determine a length of the power supply cable on the basis of the electrical length.

Preferably, the electrical length calculating part may calculate the electrical length by using a correlation of at least one of a wavelength, a wave number, and a measurement error with a frequency to be used.

As an example, the electrical length calculating part may calculate the electrical length through [Equation 1] below, $$L = \frac{n}{\lambda/2} + \frac{1}{\beta \times \arctan\left(-\frac{50}{Z}\right)} - e \quad \text{[Equation 1]}$$

wherein L may be the electrical length, n may be a wavelength period, λ may be the wavelength, β may be the wave number, Z may be an open impedance, and e may be the measurement error.

Furthermore, the impedance measuring part may calculate the impedance on the basis of an S parameter for the power supply cable to be applied.

According to the present disclosure as described above, there is provided a method for solving a process error due to a difference in impedance of a power supply cable during plasma processing using plasma generated with RF power of several tens of MHz or more.

The present disclosure can solve the problem of the related art in which when determining a power supply cable on the basis of a physical length, there is no problem at low frequencies, but a difference in physical length of several tens of mm at radio frequencies causes a difference in impedance.

In particular, at radio frequencies, the impedance is affected by the condition of a cable core and an insulator. When determining the cable simply on the basis of the physical length, the impedance is changed depending on the condition of the cable and insulator, thereby reducing the process yield. Therefore, this problem can be effectively resolved.

Furthermore, by determining a power supply cable having a physical length by reflecting an electrical length for proper impedance matching, it is possible to improve impedance variations when disposing a power supply cable for power supply to the plasma processing equipment.

The effects of the present disclosure are not limited to those mentioned above, and other effects not mentioned will be clearly understood by those of ordinary skill in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 3 is a view illustrating an example of impedance when determining a cable on the basis of a physical length;

DETAILED DESCRIPTION OF THE INVENTION

Hereinafter, exemplary embodiments of the present disclosure will be described in detail with reference to the accompanying drawings, but the present disclosure is not limited by these embodiments.

The present disclosure, operational advantages of the present disclosure, and objectives achieved by executing the present disclosure will be, hereinafter, described by exemplifying preferred embodiments of the present disclosure and referring to the exemplified embodiments.

First, terms used herein is for the purpose of describing particular embodiments only and is not intended to be limiting. As used herein, the singular forms "a," "an", and "the" are intended to include the plural forms as well, unless the context clearly indicates otherwise. Further, it will be understood that the terms "comprise", "include", and/or "have" when used herein, specify the presence of stated features, integers, steps, operations, elements, and/or components, but do not preclude the presence or addition of one or more other features, integers, steps, operations, elements, components, and/or groups thereof.

In the following description, a detailed description of related known configurations or functions may be omitted to avoid obscuring the subject matter of the present disclosure.

The present disclosure relates to a method of determining a length of a power supply cable for plasma processing equipment that performs plasma processing through power supply at radio frequencies (RF) of several tens of MHz or more.

Figure 1:
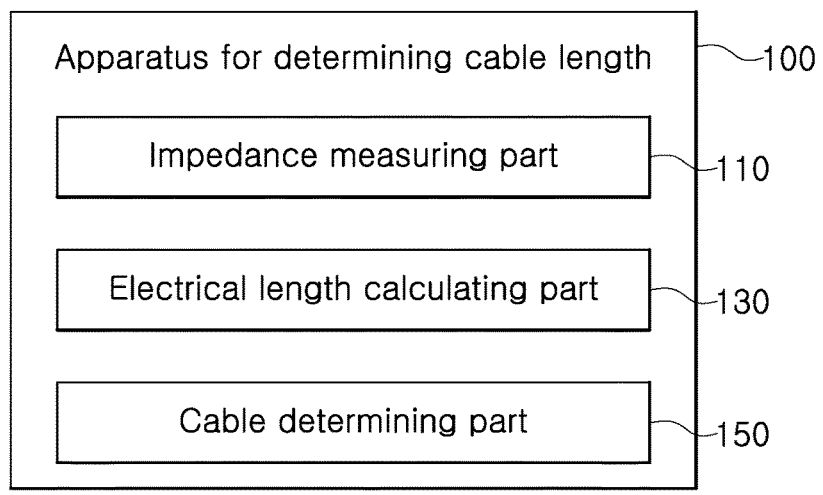
FIG. 1 a block diagram illustrating the configuration of an embodiment of an apparatus for determining a cable length according to the present disclosure.

FIG. 1 a block diagram illustrating the configuration of an embodiment of an apparatus 100 for determining a cable length according to the present disclosure.

The apparatus 100 for determining the cable length according to the present disclosure may schematically include an impedance measuring part 110, an electrical length calculating part 130, a cable determining part 150, and the like.

The impedance measuring part 110 may include an impedance measuring instrument for measuring an impedance of a power supply cable to be applied.

Here, various methods may be applied to measure the impedance. As an example, the impedance may be calculated on the basis of an S parameter for the power supply cable to be applied. In other words, the impedance may be measured by applying a parameter for analyzing RF characteristics through a difference between an input voltage and an output voltage on a frequency distribution.

Preferably, an open impedance S11 is calculated. S11 is a reflection coefficient, which means an index calculated by calculating the amount of reflection caused by an impedance difference as the ratio of an input voltage to a reflected voltage. As the value of S11 becomes smaller, the amount of reflection is decreased, and impedance matching is performed properly.

The electrical length calculating part 130 may calculate an electrical length of the power supply cable on the basis of the measured impedance.

The electrical length calculating part 130 may calculate the electrical length by using a correlation of at least one of a wavelength, a wave number, and a measurement error with a frequency to be used.

As an example, the electrical length calculating part 130 may calculate the electrical length through [Equation 1] below.

$$L = \frac{n}{\lambda/2} + \frac{1}{\beta \times \arctan\left(-\frac{50}{Z}\right)} - e \quad \text{[Equation 1]}$$

wherein L is the electrical length, n is a wavelength period, λ is the wavelength, β is the wave number, Z is an open impedance, and e is the measurement error. The measurement error e may be a numerical value calculated through repeated experimental results.

The cable determining part 150 may determine a length of the power supply cable to be applied in consideration of an electrical length that meets power supply requirements for the plasma processing equipment.

For example, the power supply cable may be determined by reflecting an electrical length considering the impedance difference according to various conditions such as a cable and an insulator during impedance matching, in addition to a physical length for supplying power to an antenna of a plasma reaction chamber through an RF generator.

Figure 2:
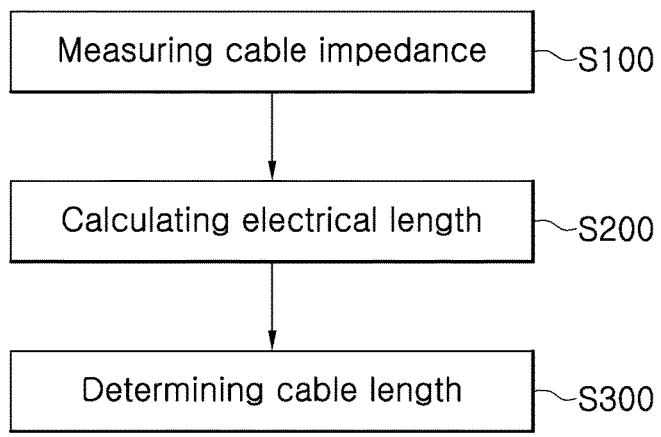
FIG. 2 is a flowchart illustrating an embodiment of a method of determining a cable length for plasma processing equipment according to the present disclosure.

Furthermore, the present disclosure provides a method of determining a cable length for plasma processing equipment through the apparatus for determining the cable length. FIG. 2 is a flowchart illustrating an embodiment of a method of determining a cable length for plasma processing equipment according to the present disclosure.

The method of determining the cable length for the plasma processing equipment according to the present disclosure may include: an impedance measuring step S100 of measuring an impedance of a power supply cable to be applied; an electrical length calculating step S200 of calculating an electrical length of the power supply cable on the basis of the measured impedance; and a cable length determining step S300 of determining a length of the power supply cable on the basis of the calculated electrical length.

In the present disclosure, when determining an RF power supply cable for a plasma process, proper impedance matching may be achieved by determining the power supply cable by calculating not only the physical length but also the electrical length.

In general, when the physical length of the power supply cable is measured and applied to the plasma processing equipment, there is no problem when supplying low-frequency power. However, when supplying RF power having a frequency of several tens of MHz or more, the impedance may be changed depending on the condition of the cable and an insulator, so that proper impedance matching may not be performed.

Figure 4A:
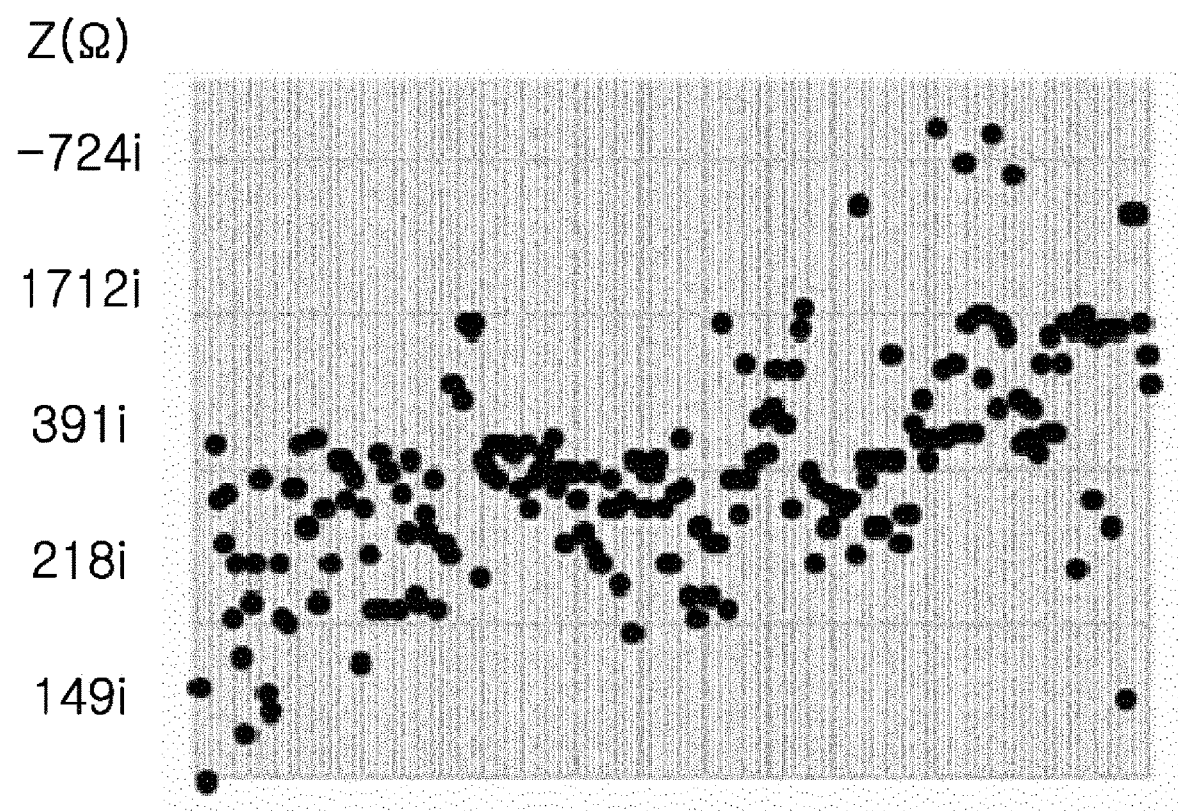
FIGS. 4A and 4B are views illustrating an example of a process performance result when determining a cable on the basis of a physical length.
Figure 4B:
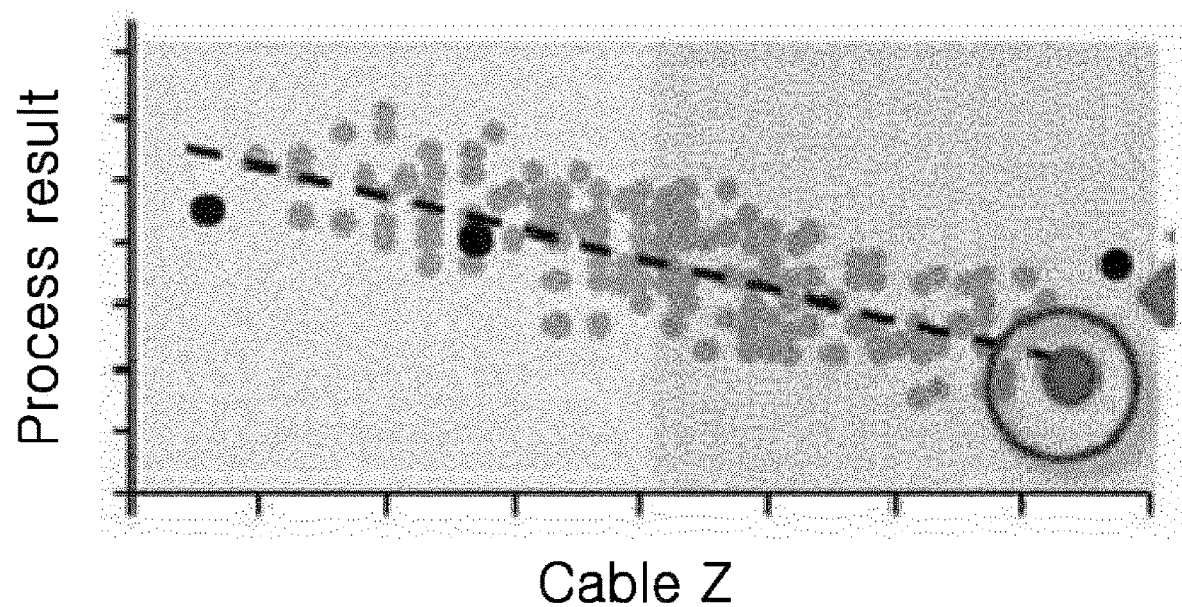

FIG. 3 is a view illustrating an example of impedance when determining a cable on the basis of a physical length. FIGS. 4A and 4B are views illustrating an example of a process performance result when determining a cable on the basis of a physical length.

As illustrated in FIG. 3, actual measured physical lengths of a power supply cable are approximately 3 m within a certain error range. However, even when the physical lengths are at the same level, the impedance may be remarkably changed depending on the condition of the power supply cable.

When the power supply cable having the same level of physical lengths is applied, the impedance thereof is changed as illustrated in FIG. 4A. This impedance change may not guarantee the stability and reliability of the process result as illustrated in FIG. 4B, thereby significantly reducing the process yield.

Therefore, in the present disclosure, efficient impedance matching may be achieved by measuring the impedance of the power supply cable, calculating the electrical length of the power supply cable on the basis of the measured impedance, and determining an appropriate electrical length of the power supply cable.

First, the apparatus 100 for determining the cable length may measure the impedance of the power supply cable to be applied (S100). The impedance may be calculated on the basis of an S parameter for the power supply cable to be applied.

In the case of RF frequencies, there is a problem in that it is difficult to measure the impedance by determining a certain measurement point due to the short wavelength period. Therefore, the characteristics of an RF circuit may be analyzed through a relative value between input and output signals by using the ratio of a voltage V to a current I on a frequency distribution. In this case, the S parameter may be applied.

Then, the apparatus 100 for determining the cable length may calculate the electrical length of the power supply cable on the basis of the measured impedance (S200). At this time, the electrical length may be calculated using a correlation of at least one of a wavelength, a wave number, and a measurement error with a frequency to be used.

As an example, the electrical length L may be calculated through [Equation 1] below.

$$L = \frac{n}{\lambda/2} + \frac{1}{\beta \times \arctan\left(-\frac{50}{Z}\right)} - e \qquad \text{[Equation 1]}$$

wherein L is the electrical length, n is a wavelength period, λ is the wavelength, β is the wave number, Z is an open impedance, and e is the measurement error. The measurement error e may be a numerical value calculated through repeated experimental results.

Figure 5:
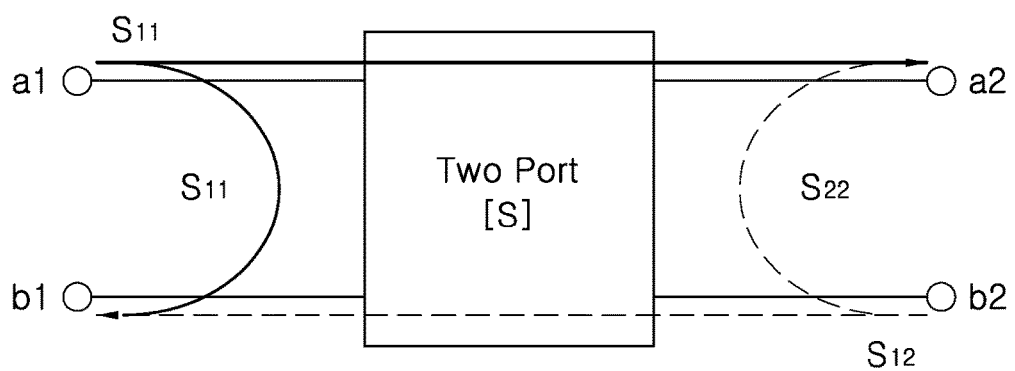
FIG. 5 is a conceptual diagram illustrating an S parameter for impedance measurement in the present disclosure.

In [Equation 1], the open impedance Z is applied. FIG. 5 is a conceptual diagram illustrating the S parameter for impedance measurement in the present disclosure.

In a two-port circuit illustrated in FIG. 5, an input value and an output value may be expressed as an S parameter as illustrated in [Equation 2] below.

$$\begin{bmatrix} b1 \\ b2 \end{bmatrix} = \begin{bmatrix} S11 & S12 \\ S21 & S22 \end{bmatrix} \begin{bmatrix} a1 \\ a2 \end{bmatrix} \qquad \text{[Equation 2]}$$

wherein S11 is an input port voltage reflection coefficient, S12 is a reverse voltage gain, S21 is a forward voltage gain, and S22 is an output voltage reflection coefficient.

In an RF circuit, impedance matching is very important. When proper impedance matching is not achieved, a reflected wave is generated. Therefore, as the reflected wave is minimized, impedance matching may be properly performed.

Figures 6, 7:
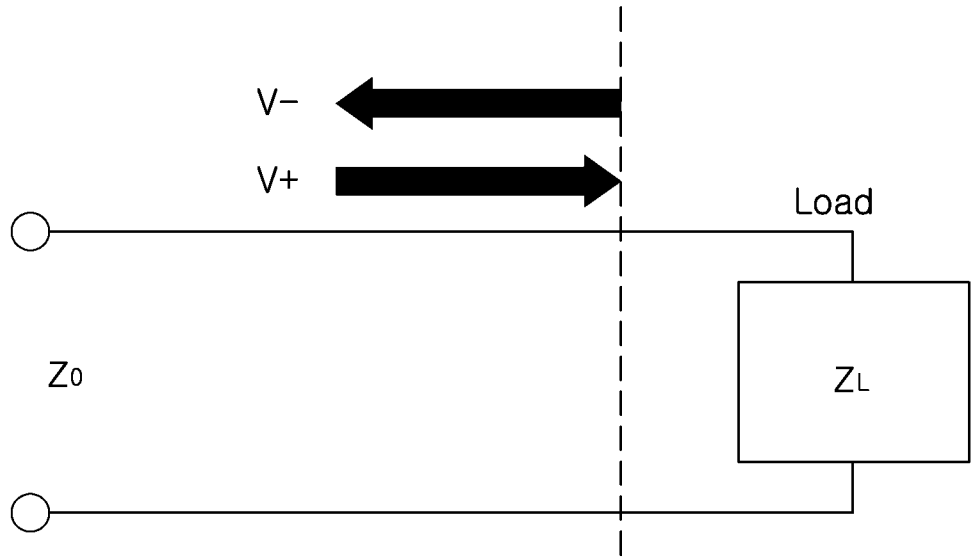
FIG. 6 is a view illustrating an example of reflection coefficient measurement for impedance measurement in the present disclosure.
FIG. 7 is a view illustrating an example of determining a cable on the basis of an electrical length through the present disclosure.

FIG. 6 is a view illustrating an example of reflection coefficient measurement for impedance measurement in the present disclosure.

The reflection coefficient may be an index calculated by calculating the amount of reflection caused by an impedance difference as the ratio of an input voltage to a reflected voltage.

For example, in FIG. 6, the reflection coefficient Γ may be calculated through [Equation 3] below.

$$\Gamma = V^-/V^+ (Z_L - Z_O)/(Z_L + Z_O) \qquad \text{[Equation 3]}$$

In other words, the value of S11 may be calculated through [Equation 3].

The open impedance Z may be calculated on the basis of the calculated S11, and the electrical length of the cable may be calculated by reflecting the open impedance Z in [Equation 1].

Then, the apparatus 100 for determining the cable length may determine a power supply cable having a required physical length by reflecting the electrical length of the power supply cable for impedance matching (S300).

FIG. 7 is a view illustrating an example of determining a cable on the basis of an electrical length through the present disclosure.

As illustrated in FIG. 7, physical lengths of a cable are different, but impedances thereof may be similar at a certain level. An electrical length of the cable required for impedance matching may be determined by reflecting this impedance.

In other words, by determining a power supply cable having a physical length by reflecting an electrical length for proper impedance matching, it is possible to improve impedance variations when disposing the power supply cable for power supply to the plasma processing equipment.

According to the present disclosure as described above, it is possible to solve a process error due to a difference in impedance of a power supply cable during plasma processing using plasma generated with RF power of several tens of MHz or more.

Although exemplary embodiments of the present disclosure have been described for illustrative purposes, those skilled in the art will appreciate that various modifications, additions, and substitutions are possible, without departing from the scope and spirit of the present disclosure. Therefore, exemplary embodiments of the present disclosure have not been described for limiting purposes, and the scope of the disclosure is not to be limited by the above embodiments. The scope of the present disclosure should be determined on the basis of the descriptions in the appended claims, and all equivalents thereof belong to the scope of the present disclosure.

What is claimed is:

1. A method of setting plasma processing equipment, the method comprising:
   an impedance measuring step of measuring an impedance of a power supply cable to be applied;
   an electrical length calculating step of calculating an electrical length of the power supply cable on the basis of the measured impedance;
   a cable length determining step of determining a length of the power supply cable on the basis of the calculated electrical length; and
   applying the power supply cable having the determined length to the plasma processing equipment,
   wherein the electrical length calculating step is performed by calculating the electrical length through [Equation 1] below:

$$L = \frac{n}{\lambda/2} + \frac{1}{\beta \times \arctan\left(-\frac{50}{Z}\right)} - e, \qquad \text{[Equation 1]}$$

and
   wherein L is the electrical length, n is a wavelength period, λ is a wavelength, β is a wave number, Z is an open impedance, and e is a measurement error.

2. The method of claim 1,
   wherein the impedance measuring step is performed by calculating the impedance on the basis of an S parameter for the power supply cable to be applied.

3. The method of claim 1,
   wherein the impedance measuring step is performed by calculating the impedance on the basis of a parameter for analyzing RF characteristics through a difference between an input voltage and an output voltage on a frequency distribution.

4. The method of claim 3,
   wherein the impedance measuring step is performed by calculating a reflection coefficient on the basis of an S parameter.

5. The method of claim 1,
   wherein the cable length determining step is performed by determining the length of the power supply cable on the basis of the electrical length calculated to correspond to an electrical length that meets power supply requirements for the plasma processing equipment.

6. An apparatus for determining a cable length for plasma processing equipment, the apparatus comprising:
   an impedance measuring part configured to measure an impedance of a power supply cable to be applied;
   an electrical length calculating part configured to calculate an electrical length of the power supply cable on the basis of the measured impedance; and
   a cable determining part configured to determine a length of the power supply cable on the basis of the electrical length to apply the power supply cable to the plasma processing equipment,
   wherein the electrical length calculating part calculates the electrical length through [Equation 1] below:

$$L = \frac{n}{\lambda/2} + \frac{1}{\beta \times \arctan\left(-\frac{50}{Z}\right)} - e, \qquad \text{[Equation 1]}$$

and
   wherein L is the electrical length, n is a wavelength period, λ is a wavelength, β is a wave number, Z is an open impedance, and e is a measurement error.

7. The apparatus of claim 6,
   wherein the impedance measuring part calculates the impedance on the basis of a parameter for analyzing RF characteristics through a difference between an input voltage and an output voltage on a frequency distribution.

8. The apparatus of claim 7,
   wherein the impedance measuring part calculates the impedance on the basis of an S parameter for the power supply cable to be applied.

9. The apparatus of claim 6,
   wherein the cable determining part determines the length of the power supply cable on the basis of the electrical length calculated to correspond to an electrical length that meets power supply requirements for the plasma processing equipment.

10. A method of setting plasma processing equipment, the method comprising:
   an impedance measuring step of calculating and measuring an impedance on the basis of an S parameter for a power supply cable to be applied;
   an electrical length calculating step of calculating an electrical length by using a correlation of at least one of a wavelength, a wave number, and a measurement error with a frequency to be used by the power supply cable on the basis of the measured impedance;

a cable length determining step of determining a length of the power supply cable on the basis of the electrical length calculated to correspond to an electrical length that meets power supply requirements for the plasma processing equipment; and applying the power supply cable having the determined length to the plasma equipment, wherein the electrical length calculating step is performed by calculating the electrical length through [Equation 1] below:

$$L = \frac{n}{\lambda/2} + \frac{1}{\beta \times \arctan\left(-\frac{50}{Z}\right)} - e, \qquad \text{[Equation 1]}$$

and wherein L is the electrical length, n is a wavelength period, $\lambda$ is a wavelength, $\beta$ is a wave number, Z is an open impedance, and e is a measurement error.

* * * * *